United States Patent
Furuki

(10) Patent No.: US 7,523,419 B2
(45) Date of Patent: Apr. 21, 2009

(54) SEMICONDUCTOR INTEGRATED DEVICE FOR PREVENTING BREAKDOWN AND DEGRADATION OF A GATE OXIDE FILM CAUSED BY CHARGE-UP IN MANUFACTURING STEPS THEREOF, DESIGN METHOD THEREOF, DESIGNING APPARATUS METHOD THEREOF, AND MAUNFACTURING APPARATUS THEREOF

(75) Inventor: Tsutomu Furuki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 491 days.

(21) Appl. No.: 11/259,129

(22) Filed: Oct. 27, 2005

(65) Prior Publication Data

US 2006/0094164 A1   May 4, 2006

(30) Foreign Application Priority Data

Oct. 29, 2004   (JP) ............................. 2004-316736

(51) Int. Cl.
G06F 17/50   (2006.01)
(52) U.S. Cl. .................................. 716/1; 716/8; 716/9
(58) Field of Classification Search .................. 716/1, 716/8, 9, 21; 357/369, 355
See application file for complete search history.

(56) References Cited

U.S. PATENT DOCUMENTS

| | | | |
|---|---|---|---|
| 5,955,764 A * | 9/1999 | Katsube | 257/355 |
| 6,075,292 A * | 6/2000 | Noguchi | 257/758 |
| 6,421,816 B1 * | 7/2002 | Ishikura | 716/7 |
| 6,815,771 B2 * | 11/2004 | Kimura | 257/347 |
| 6,882,014 B2 * | 4/2005 | Tan | 257/369 |
| 7,135,722 B2 * | 11/2006 | Matsunaga et al. | 257/211 |

(Continued)

FOREIGN PATENT DOCUMENTS

JP    11-186394    7/1999

(Continued)

OTHER PUBLICATIONS

Kong, "CAD for Nanometer Silicon Design Challenges and Success", Nov. 2004, IEEE Transactions on Very Large Scale Integration (VLSI) Systems, vol. 12, No. 11, pp. 1132-1147.*

*Primary Examiner*—Sun J Lin
(74) *Attorney, Agent, or Firm*—McGinn IP Law Group, PLLC

(57) ABSTRACT

Semiconductor integrated circuit that prevents breakdown and degradation of a gate oxide film caused by charge-up in manufacturing steps thereof is provided. The circuit includes a gate 12 provided insulated from a transistor diffusion layer 11, wirings 13 and 14 connected to the gate 12, a wiring 15 parallel to and adjacent to the wiring 13, and a wiring 16 connected to the wiring 15. The gate area of the gate 12 is indicated by G_Area, and the gate capacitance of the gate 12 is indicated by G_Cap. The areas of the wirings 13, 14, 15, and 16 are indicated by MG1_Area, MG2_Area, M1_Area, and M2_Area, respectively, and a parasitic capacitance between the wirings 13 and 15 is indicated by M1_Cap. An antenna ratio R1 calculated from the areas is given by an equation R1={(MG1_Area+MG2_Area)+α(M1_Area+M2_Area)}/G_Area. α is a parameter determined by a function of the G_Cap and the M1_Cap. Layout of the wirings is performed so that a relation R1<L1 (which is a specified value that causes damage to a gate oxide film).

17 Claims, 9 Drawing Sheets

U.S. PATENT DOCUMENTS

| | | | |
|---|---|---|---|
| 7,262,505 B2 * | 8/2007 | Ahn et al. | 257/762 |
| 2001/0018757 A1 * | 8/2001 | Morikawa | 716/5 |
| 2002/0141257 A1 * | 10/2002 | Ide | 365/200 |
| 2004/0088658 A1 * | 5/2004 | Minda | 716/1 |

FOREIGN PATENT DOCUMENTS

| | | |
|---|---|---|
| JP | 11-297836 | 10/1999 |
| JP | 2001-257265 | 9/2001 |
| JP | 2004-158484 | 6/2004 |

* cited by examiner

SEMICONDUCTOR INTEGRATED DEVICE FOR PREVENTING BREAKDOWN AND DEGRADATION OF A GATE OXIDE FILM CAUSED BY CHARGE-UP IN MANUFACTURING STEPS THEREOF, DESIGN METHOD THEREOF, DESIGNING APPARATUS METHOD THEREOF, AND MAUNFACTURING APPARATUS THEREOF

FIELD OF THE INVENTION

The present invention relates to a semiconductor integrated device, a design method thereof, a designing apparatus thereof, a program thereof, a manufacturing method thereof, and a manufacturing apparatus thereof. More specifically, the invention relates to the semiconductor integrated device for preventing breakdown and degradation of a gate oxide film caused by charge-up in manufacturing steps thereof, design method thereof, designing apparatus thereof, program thereof, manufacturing method thereof, and manufacturing apparatus thereof.

BACKGROUND OF THE INVENTION

In manufacturing steps of semiconductor integrated circuits, a technology employing plasma or an ion beam is used. In such steps, when a wiring of the semiconductor integrated circuit is the one that is not connected to a diffusion layer connected to a gate electrode, charges are accumulated on the wiring. Then, the amount of the charges exceeds a certain amount, the breakdown or degradation of the gate oxide film is caused, or degradation in the performance of a transistor is caused. Such a phenomenon is referred to as an antenna effect.

In order to prevent charge-up damage to the gate oxide film caused by the antenna effect, it has become a common practice to limit the area of the wiring directly connected to a gate or the peripheral length of the wiring converted to the area of the wiring, according to the area or capacitance of the gate, at the time of designing the semiconductor integrated circuit. A measure against the charge-up is thereby taken.

FIG. 9 is a diagram showing a layout of wiring in a conventional semiconductor integrated circuit. Referring to FIG. 9, a gate 102 is arranged for a diffusion layer 101 of a transistor. The gate area of the gate 102 is indicated by G_Area. The area of a wiring 103 directly wired to the gate 102 is indicated by MG1_Area. Further, the area of a wiring 104 in other layer, directly wired to the gate 102 is indicated by MG2_Area. In this case, ratio given by (MG1_Area+MG2_Area)/G_Area is referred to as an antenna ratio. Incidentally, the antenna ratio may also be a ratio of respective peripheral lengths of the wirings to that of the gate, in place the ratio of their areas. When designing the semiconductor integrated circuit, the wirings 103 and 104 directly wired to the gate 102 are arranged so that the antenna ratio becomes smaller than a predetermined value L.

As a specific example of the wiring arrangement, insertion of a repeater cell or a diode cell to the wiring is performed when the antenna ratio exceeds a predetermined value (refer to Patent Document 1, for example). Further, there is also known a method in which part of the wiring is wired in other wiring layer such as an uppermost wiring layer when the antenna ratio exceeds the predetermined value (refer to Patent Documents 1, 2, and 4). Further, there is also a method of using a cell in which the size of the transistor has been adjusted or to which a new transistor has been added so that the area of the gate based on the antenna ratio becomes a predetermined value or more (refer to Patent Document 3, for example).

[Patent Document 1] JP Patent Kokai Publication No. JP-A-11-297836
[Patent Document 2] JP Patent Kokai Publication No. JP-P-2001-257265A
[Patent Document 3] JP Patent Kokai Publication No. JP-P-2004-158484A
[Patent Document 2] JP Patent Kokai Publication No. JP-P-11-186394

SUMMARY OF THE DISCLOSURE

As smaller device geometries are achieved in a semiconductor process, however, the influence of parasitic capacitance between wirings will increase. Thus, it has become difficult to obtain the semiconductor integrated circuit that is sufficiently stable with respect to the antenna effect. For this reason, the need for performing design with a certain allowance with respect to the conventional antenna ratio is generated. The area of the wiring directly connected to the gate would be thereby limited more than necessary. In other words, this results in heavy use of insertion of the repeater cell or the diode cell to the wiring, wiring in the uppermost wiring layer, utilization of the cell in which the size of the transistor has been adjusted or to which the new transistor has been added so that the area of the gate becomes the predetermined value or more or the like. Accordingly, it has more often occurred that sufficient reduction in the size of a chip cannot be achieved.

The inventor of the present invention has noticed that as the smaller device geometries in the semiconductor process have been achieved, there is seen a problem of the charge-up that cannot be solved just by using the conventional method of placing a constraint on the wiring directly connected to the gate. Then, the inventor has found that the semiconductor integrated device should be designed and manufactured also in consideration of the influence of the charge-up through the interconnect capacitance on a wiring adjacent to the wiring directly connected to the gate. The present invention thus has been made.

A design method according to an aspect of the present invention is the method of designing a wiring layout for a semiconductor device by a designing apparatus. In this method, the layout of first to (n+1)th wirings is performed so that an area ratio of an area of an electrode of an element provided insulated from a diffusion layer to a sum of an area of a first wiring connected to the electrode and a summation of areas of the first to nth wirings each multiplied by a predetermined coefficient $a_k$ becomes equal to or less than a predetermined value that gives charge-up damage to an insulating film of the electrode, where the k is an integer equal to or larger than one, ranging from one to n, (n being an integer equal to or larger than one). The (k+1)th wiring is provided in parallel to or adjacent to the kth wiring.

A manufacturing method according to an aspect of the present invention is the method of manufacturing a semiconductor integrated device by a manufacturing apparatus. In this method, the semiconductor integrated device is manufactured so that an area ratio of a sum of an area of a first wiring plus the summation of all the areas of a (k+1)th wiring multiplied by a predetermined coefficient $a_k$, (k being an integer equal to or larger than one that) ranging from one to n, (n being an integer equal to or larger than one) to an area of an electrode of an element becomes less than an antenna ratio determined from a manufacturing condition of the manufacturing apparatus. The first wiring is connected to the electrode of the element. The electrode of the element is provided insulated from a diffusion layer. The (k+1)th wiring is parallel to and adjacent to the kth wiring.

A semiconductor integrated device according to an aspect of the present invention includes an element having an electrode provided insulated from a diffusion layer, a first wiring connected to the electrode, and a (k+1)th wiring parallel to and adjacent to a kth wiring (k being an integer equal to or larger than one). The first to (k+1)th wirings are arranged so that the area ratio of the a sum of an area of the first wiring plus a summation of areas of wirings from a second wiring to the (k+1)th wiring to the area of the electrode becomes equal to or less than a predetermined value that gives charge-up damage to the insulating film of the electrode. The summation of the areas of the wiring from the second electrode to the (k+1)th wiring are given as a summation of all the areas of the wirings from the second wiring to the (k+1)th wiring each multiplied by a predetermined coefficient $a_k$, where k ranges from one to n (n being an integer equal to or larger than one).

A designing apparatus according to one aspect of the present invention includes:

a circuit data storage unit for storing circuit data on a semiconductor integrated device targeted for design;

a layout execution unit for reading out the circuit data stored in the circuit data storage unit, for execution of circuit arrangement and wiring, and delivering the result of the arrangement and the wiring to a wiring check unit as layout data, the layout execution unit also changing a wiring condition and executing the circuit arrangement and wiring again when the layout data checked by the wiring check unit does not satisfy an antenna condition, and storing the layout data in a layout data storage unit when the layout data satisfies the antenna condition;

a wiring check unit for checking whether an area ratio of a sum of an area of a first wiring plus a summation of all the areas of a (k+1)th wiring multiplied by a predetermined coefficient $a_k$, (k being an integer equal to or larger than one) ranging from one to n (n being an integer equal to or larger than one), to the area of an electrode is equal to or less than a predetermined value that gives charge-up damage to the insulating film of the electrode, and notifying the result of the check to the layout execution unit, the first wiring being connected to the electrode provided insulated from the diffusion layer of an element in the semiconductor integrated circuit, the (k+1)th wiring being parallel to and adjacent to the kth wiring; and a layout data storage unit for storing the layout data satisfying the antenna condition.

A manufacturing apparatus according to an aspect of the present invention includes:

a layout data storage unit for storing layout data on a semiconductor integrated device targeted for manufacturing;

a wiring check unit for checking whether the area ratio of a sum of an area of a first wiring plus a summation of all the areas of a (k+1)th wiring multiplied by a predetermined coefficient $a_k$, (k being an integer equal to or larger than one) ranging from one to n (n being an integer equal to or larger than one), to the area of an electrode is equal to or less than a predetermined value that gives charge-up damage to the insulating film of the electrode based on the layout data, and delivering the result of the check to a manufacturing condition comparing unit, the first wiring being connected to the electrode provided insulated from the diffusion layer of an element in the semiconductor integrated circuit, the (k+1)th wiring being parallel to and adjacent to the kth wiring;

a manufacturing condition data storage unit for storing manufacturing conditions for the manufacturing;

the manufacturing condition comparing unit for comparing an antenna ratio obtained by the wiring check unit with an antenna ratio stored in the manufacturing condition data storage unit, notifying a semiconductor integrated device manufacturing unit to manufacture the semiconductor integrated device according to a predetermined one of the manufacturing conditions when the antenna ratio obtained by the wiring check unit satisfies the antenna ratio stored in the manufacturing condition data storage unit as a result of the comparison, and notifying the semiconductor integrated device manufacturing unit to adjust the predetermined one of the manufacturing conditions when the antenna ratio obtained by the wiring check unit does not satisfy the antenna ratio stored in the manufacturing condition data storage unit; and a semiconductor integrated device manufacturing unit for manufacturing the semiconductor integrated device according to the predetermined one of the manufacturing conditions or the adjusted manufacturing condition.

A program according to an aspect of the present invention is the program for a computer, for performing layout of first to (n+1)th wirings (n being an integer equal to or larger than one). This program causes the computer to function as:

layout means for performing layout on circuit data of a semiconductor integrated device targeted for design and storing the result of the layout in layout data storage means as layout data;

wiring information extracting means for extracting from the layout data stored in the layout data storage means electrode information on an element having an electrode provided insulated from a diffusion layer and wiring information on a first wiring connected to the electrode, for storage in electrode wiring information storage means;

parallel wiring information extracting means for extracting the (k+1)th wiring parallel to and adjacent to the kth wiring (k being an integer from one to n) from the layout data stored in the layout data storage means and the wiring information on the first wiring stored in the electrode wiring information storage means, for storage in parallel wiring information storage means;

area and capacitance extracting means for extracting from the layout data stored in the layout data storage means areas of the first to (k+1)th wirings, a parasitic capacitance between the kth wiring and the (k+1)th wiring, a capacitance of the electrode, and the area of the electrode all stored in the electrode wiring information storage means and the parallel wiring information storage means, for storage in area and capacitance storage means;

antenna ratio checking means for calculating an area ratio of the a sum of areas of the wirings to an area of the electrode, the sum of the areas of the wirings being given as a sum of an area of the first wiring stored in the area and capacitance storage means plus a summation of areas of the (k+1)th wiring multiplied by a predetermined coefficient $a_k$, where k ranges from one to n (n being an integer equal to or larger than one), and comparing the area ratio with a predetermined value stored in antenna ratio condition storage means; and layout modification means for changing the layout of at least one wiring of the first to (n+1)th wirings when it is found that the area ratio is larger than the predetermined value.

The meritorious effects of the present invention are summarized as follows.

According to the present invention, as a measure against an antenna effect, the semiconductor integrated device is designed and manufactured also in consideration of an influence caused by charge-up on the wiring or the like adjacent to the wiring connected to the gate. Accordingly, even if smaller device geometries is pursued in a semiconductor process, the high-quality semiconductor integrated device having wirings with the proper measure against the antenna effect taken therein and without device degradation can be obtained.

PREFERRED EMBODIMENTS OF THE INVENTION

Figure 1:
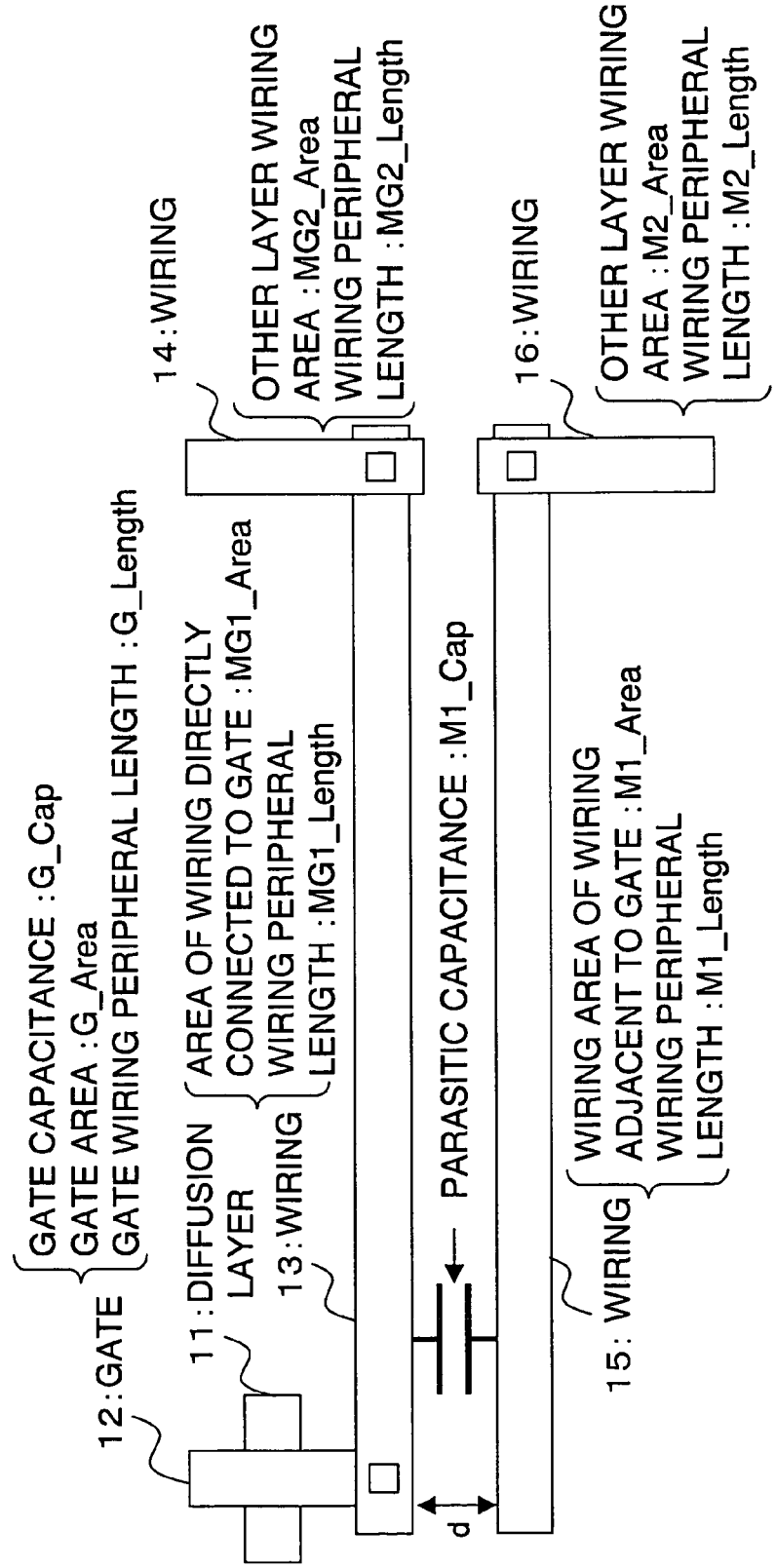
FIG. 1 is a diagram showing a layout of a semiconductor integrated circuit according to a first embodiment of the present invention.

A semiconductor integrated device according to an embodiment mode of the present invention is a circuit designed and manufactured also in consideration of the influence of charge-up through an interconnect capacitance on a wiring or the like adjacent to and in parallel with a wiring connected to the gate of the semiconductor integrated device. More specifically, the semiconductor integrated circuit includes a gate (indicated by reference numeral 12 in FIG. 1) provided insulated from the diffusion layer (indicated by reference numeral 11) of a transistor, a first wiring (indicated by reference numerals 13 and 14 in FIG. 1) connected to the gate (indicated by reference numeral 12 in FIG. 1), and a second wiring (indicated by reference numerals 15 and 16 in FIG. 1) adjacent to and parallel with the first wiring. Then, the semiconductor integrated device is designed so that the first wiring and the second wiring are arranged to make the ratio of the sum of the area of the first wiring and the area of the second wiring multiplied by a predetermined coefficient to the gate area of the gate to be equal to or less than a predetermined value that gives charge-up damage to the gate oxide film of the gate. The predetermined coefficient is the coefficient determined by the interconnect capacitance (parasitic capacitance) between the first wiring and the second wiring. Further, the semiconductor integrated device is manufactured so that an antenna ratio satisfies the antenna condition of a manufacturing apparatus for the semiconductor integrated device.

The semiconductor integrated device designed and manufactured as described above has wirings to which an appropriate measure against an antenna effect has been applied, so that device degradation is eliminated.

In the above description, the antenna ratio is obtained from the ratio among the areas. The area herein includes at least one of the surface (planar surface) areas of the wiring and a gate electrode and the side areas of the wiring and the gate electrode. The damage caused by the antenna effect is sometimes caused mainly by the side area of the wiring rather than the planar surface area of the wiring according to a manufacturing condition. Further, the damage caused by the antenna effect is also sometimes caused mainly by both of the planar surface area of the wiring and the side area of the wiring. When the damage caused by the antenna effect is mainly caused by the side area of the wiring, the antenna ratio may be determined from the side area of the wiring. Further, there is also included a case where the antenna ratio is obtained from a value obtained by adding the planar surface area to the side area multiplied by a predetermined ratio. When the thickness of a wiring film is constant, the area can also be converted from the peripheral length of the wiring.

The antenna effect occurs on a capacitance element as well as the transistor. It goes without saying that the present invention can be applied to the wiring connected to the electrode of the capacitance element such as the capacitance element between polysilicon and polysilicon or between polysilicon and a metal.

Further, at least one of the first wiring and the second wiring may be divided and wired across other layer. Further, when a plurality of wirings in parallel with and adjacent to the first or second wiring is present, and when a plurality of wirings or the like in parallel with and adjacent to any one of the plurality of wirings is present, the antenna ratio in view of the influences of these plurality of wirings may be obtained. Specific examples will be described below in more detail in connection with embodiments.

First Embodiment

FIG. 1 is a diagram showing a layout of a semiconductor integrated circuit according to a first embodiment of the present invention. Referring to FIG. 1, a gate 12 is arranged insulated from the diffusion layer 11 of the transistor. A wiring 13 is directly wired to the gate 12, and a wiring 14 connected to the wiring 13 is wired in other layer. A wiring 15 is arranged in parallel with the wiring 13 with a spacing d provided therebetween. Further, a wiring 16 connected to the wiring 15 is wired in other layer.

Herein, the gate area of the gate 12 is indicated by G_Area, the gate capacitance of the gate 12 is indicated by G_Cap, the peripheral length of the gate wiring of the gate 12 is indicated by G_Length. The area of the wiring 13 is indicated by MG1_Area, and the wiring peripheral length of the wiring 13 is indicated by MG1_Length. The area of the wiring 14 is indicated by MG2_Area, and the wiring peripheral length of the wiring 14 is indicated by MG2_Length. The area of the wiring 15 is indicated by M1_Area, and the wiring peripheral length of the wiring 15 is indicated by M1_Lenth. The area of the wiring 16 is indicated by M2_Area, and the wiring peripheral length of the wiring 16 is indicated by M2_Length. Further, a parasitic capacitance between the wiring 13 and the wiring 15 is indicated by M1_Cap.

An antenna ratio R1 calculated from capacitances and the areas is given by R1=All_Metal_Area/G_Area, in which All_Metal_Area=(MG1_Area+MG2_Area)+α (M1_Area+M2_Area), and α is the parameter α=f(G_Cap, M1_Cap) determined by a function f of the G_Cap and the M1_Cap. In this case, the layout of the wirings is carried out so that a relation R1<L1 (that is a specified value which causes damage to the gate oxide film) is satisfied.

The antenna ratio can also be obtained from the wiring peripheral lengths if the thickness of a wiring film is constant. An antenna ratio R2 calculated from the capacitances and the wiring peripheral lengths is given by R2=All_Metal_Lenghth/G_Length, in which All_Metal_Length=(MG1_Length+MG2_Length+α (M1_Length+M2_Length). In this case, the layout of the wirings is carried out so that a relation R2<L2 (that is a specified value which causes the damage to the gate oxide film) is satisfied.

When the specified value that causes the damage to the gate oxide film is not satisfied by the layout, the layout of the wirings is changed. A wiring spacing d between the wiring directly connected to the gate and the adjacent wiring, for example, is expanded. This reduces the parasitic capacitance M1_Cap, so that the antenna ratio is reduced. Alternatively, the wiring width of the wiring 15 is reduced. This reduces the area M1_Area of the wiring 15, so that the antenna ratio is reduced. Alternatively, alteration of a wiring route is effective. Further, insertion of a repeater cell or a diode cell as described in a prior art or the like is performed.

The semiconductor integrated circuit having the layout designed as described above is designed and manufactured also in consideration of the influence of the charge-up on the wiring 15 in parallel with and adjacent to the wiring 13 directly connected to the gate 12. Accordingly, even when smaller device geometries in a semiconductor process are achieved, the wirings with the appropriate measure against the antenna effect taken therein are included, so that the device degradation is eliminated.

Second Embodiment

Figure 2:
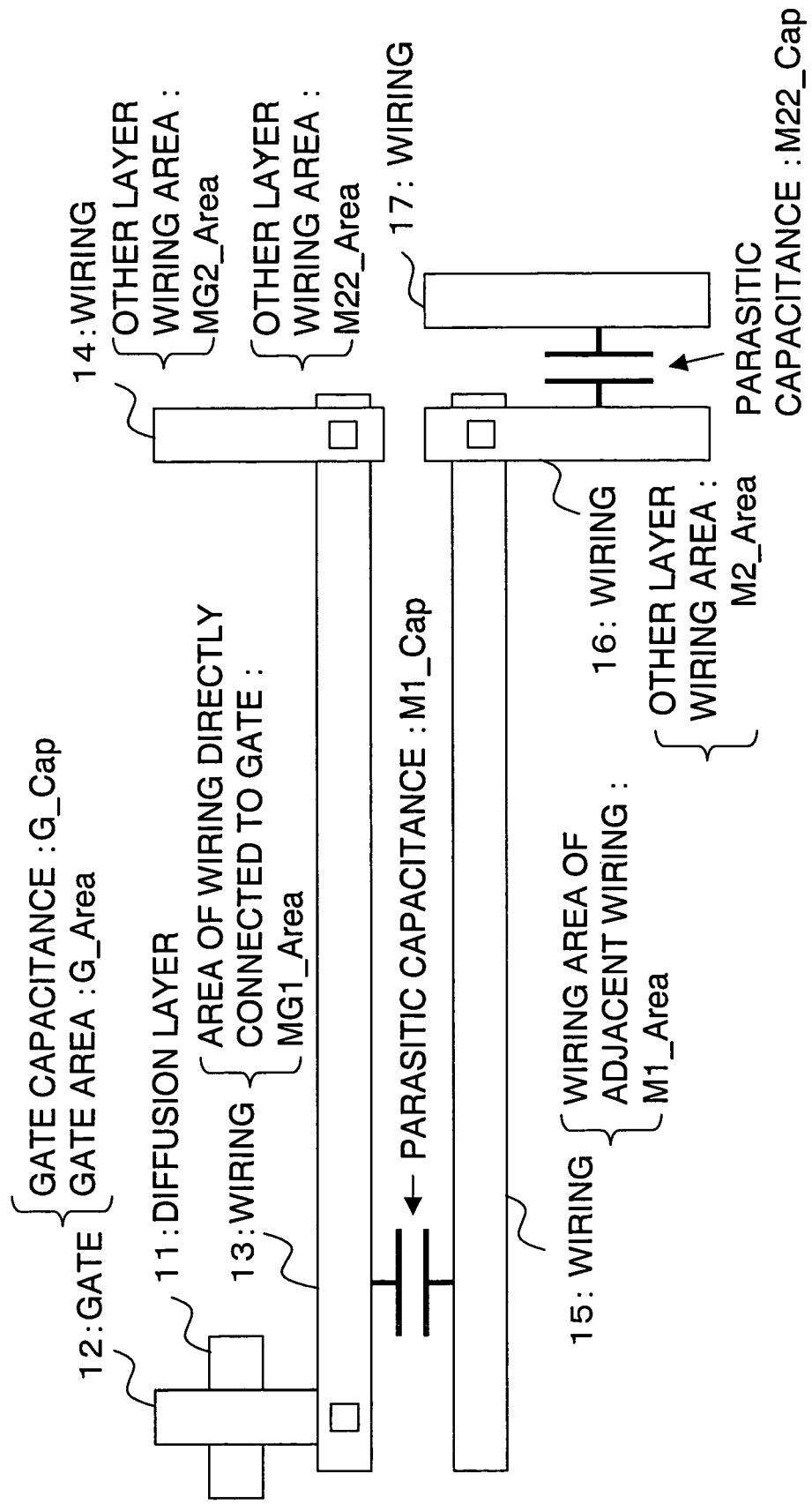
FIG. 2 is a diagram showing a layout of a semiconductor integrated circuit according to a second embodiment of the present invention.

FIG. 2 is a diagram showing a layout of a semiconductor integrated circuit according to a second embodiment of the present invention. Referring to FIG. 2, the same reference numerals as those in FIG. 1 indicate components identical to or corresponding to those in FIG. 1. The layout shown in FIG. 2 is different from the layout in FIG. 1 in that a wiring 17 is added. The wiring 17 is arranged in parallel with the wiring 16 in other layer, and the area of the wiring 17 is indicated by M22_Area. Further, a parasitic capacitance between the wiring 16 and the wiring 17 is indicated by M22_Cap.

An antenna ratio R3 calculated from the areas and the capacitances in a configuration as described above is given by R3=All_Metal_Area/G_Area, in which All_Metal_Area=(MG1_Area+MG2_Area)+α (M1_Area+M2_Area)+β (M22_Area), and α is the parameter α=f1(G_Cap, M1_Cap) determined by a function f1 of the G_Cap and the M1_Cap. β is the parameter β=f2 (G_Cap, M1_Cap, M22_Cap) determined by a function f2 of the G_Cap, M1_Cap, and M22_Cap. In this case, the layout of the wirings is carried out so that a relation R3<L1 (that is the specified value which causes damage to the gate oxide film) is satisfied.

The antenna ratio calculated from the capacitances and the wiring peripheral lengths are considered in the same manner as in the first embodiment, in view of the wiring 17. Further, in regard to a change in the layout of the wirings as well when the specified value that causes the damage to the gate oxide film is not satisfied, the change is performed in the same manner as in the first embodiment.

The semiconductor integrated circuit having the layout designed as described above is designed and manufactured also in consideration of the influence of the charge-up on the wiring 15 in parallel with and adjacent to the wiring 13 directly connected to the gate 12 and the influence of the charge-up on the wiring 17 in parallel with and adjacent to the wiring 16 connected to the wiring 15. Accordingly, the semiconductor integrated circuit without the device degradation like that in the first embodiment can be obtained.

Third Embodiment

Figure 3:
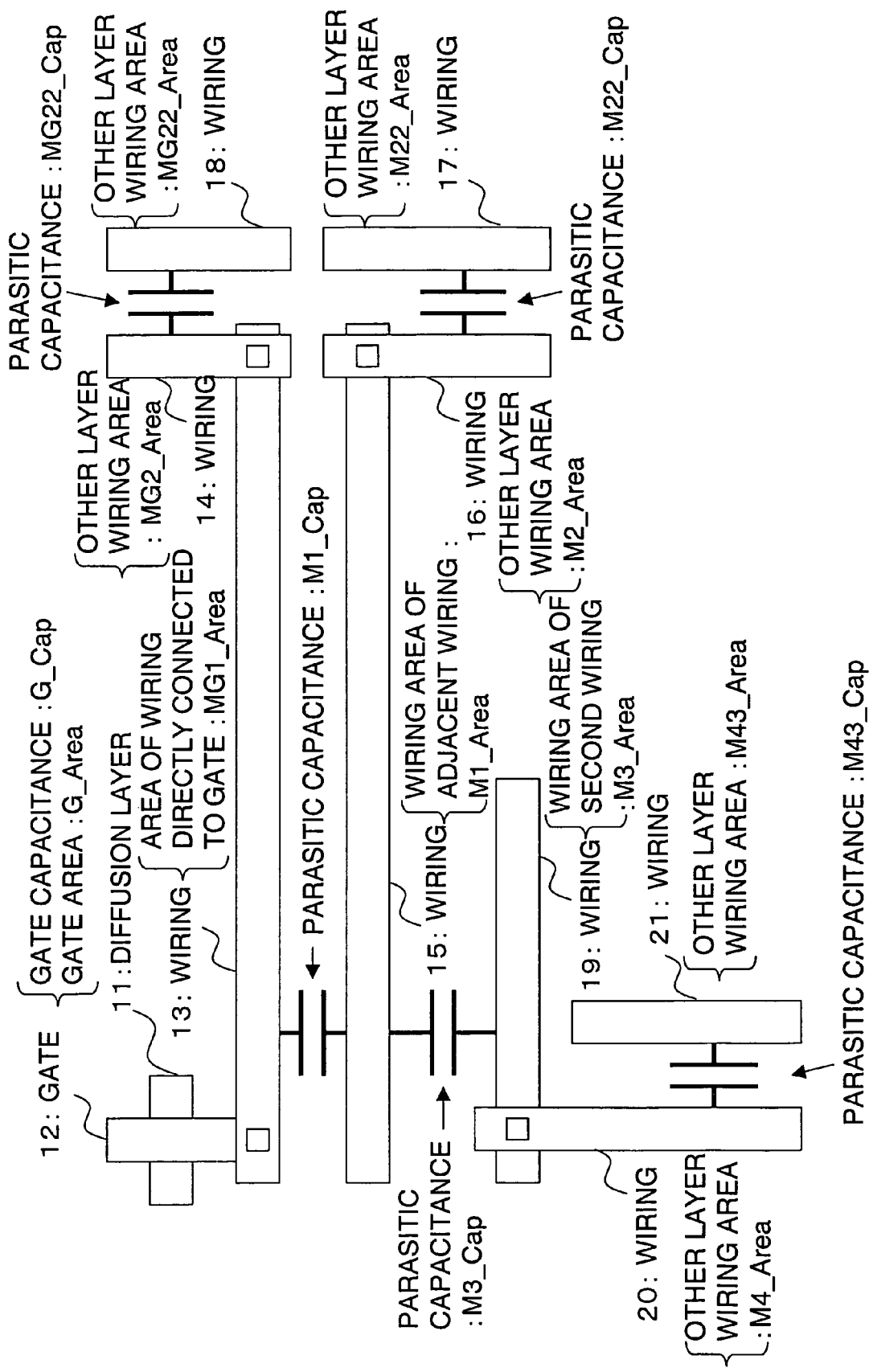
FIG. 3 is a diagram showing a layout of a semiconductor integrated circuit according to a third embodiment of the present invention.

FIG. 3 is a diagram showing a layout of a semiconductor integrated circuit according to a third embodiment of the present invention. Referring to FIG. 3, the same reference numerals as those in FIG. 2 indicate components identical to or corresponding to those in FIG. 2. The layout shown in FIG. 3 is different from the layout in FIG. 2 in that a wiring 18, a wiring 19, a wiring 20, and a wiring 21 are added.

The wiring 18 is wired adjacent to and in parallel to the wiring 14 in other layer. The area of the wiring 18 is indicated by MG22_Area. A parasitic capacitance between the wiring 14 and the wiring 18 is indicated by MG22_Cap. The wiring 19 is wired adjacent to and in parallel with the wiring 15, and the area of the wiring 19 is indicated by M3_Area. A parasitic capacitance between the wiring 15 and the wiring 19 is indicated by M3_Cap. The wiring 20 is wired connected to the wiring 19 in other layer, and the area of the wiring 20 is indicated by M4_Area. The wiring 21 is wired adjacent to and in parallel with the wiring 20 in the other layer, and the area of the wiring 21 is indicated by M43_Area. A parasitic capacitance between the wiring 20 and the wiring 21 is indicated by M43_Cap.

An antenna ratio R4 calculated from the areas and the capacitances in a configuration as described above is given by R4=All_Metal_Area/G_Area, in which All_Metal_Area=(MG1_Area+MG2_Area)+α (M1_Area+M2_Area)+β·MG22_Area+γ·M22_Area+δ (M3_Area+M4_Area)+ε·M43_Area. α is the parameter α=f1(G_Cap, M1_Cap) determined by the function f1 of the G_Cap and the M1_Cap. β is the parameter β=f2 (G_Cap, M22_Cap) determined by a function f2 of the G_Cap and M22_Cap. γ is the parameter γ=f3(G_Cap, M1_Cap, M22_Cap) determined by a function f3 of the G_Cap, the M1_Cap, and M22_Cap. δ is the parameter δ=f4(G_Cap, M1_Cap, M3_Cap) determined by a function f4 of the G_Cap, M1_Cap, and M3_Cap. ε is the parameter ε=f5(G_Cap, M1_Cap, M3_Cap, M43_Cap) determined by a function f5 of the G_Cap, M1_Cap, M3_Cap, and M43_Cap. In this case, the layout of the wirings is performed so that a relation R4<L1 (that is the specified value which causes damage to the gate oxide film) is satisfied.

The antenna ratio calculated from the capacitances and the wiring peripheral lengths is considered in the same manner as in the second embodiment, in view of the wiring 18, wiring 19, wiring 20, and wiring 21. Further, in regard to a change in the layout of the wirings as well when the specified value that causes the damage to the gate oxide film is not satisfied, the change is performed in the same manner as in the first embodiment.

The semiconductor integrated circuit having the layout designed as described above is designed and manufactured also in view of the influence of the charge-up on the wiring 17, wiring 18, wiring 19, wiring 20, wiring 21 as well as the wiring 15 in parallel with and adjacent to the wiring 13 directly connected to the gate 12. Accordingly, the semiconductor integrated circuit without the device degradation like the semiconductor integrated circuit in the first embodiment can be obtained.

In addition, even when an adjacent wiring is further increased, the increase is handled by performing expansion of a calculation formula as in the first to three embodiments.

Fourth Embodiment

Figure 4:
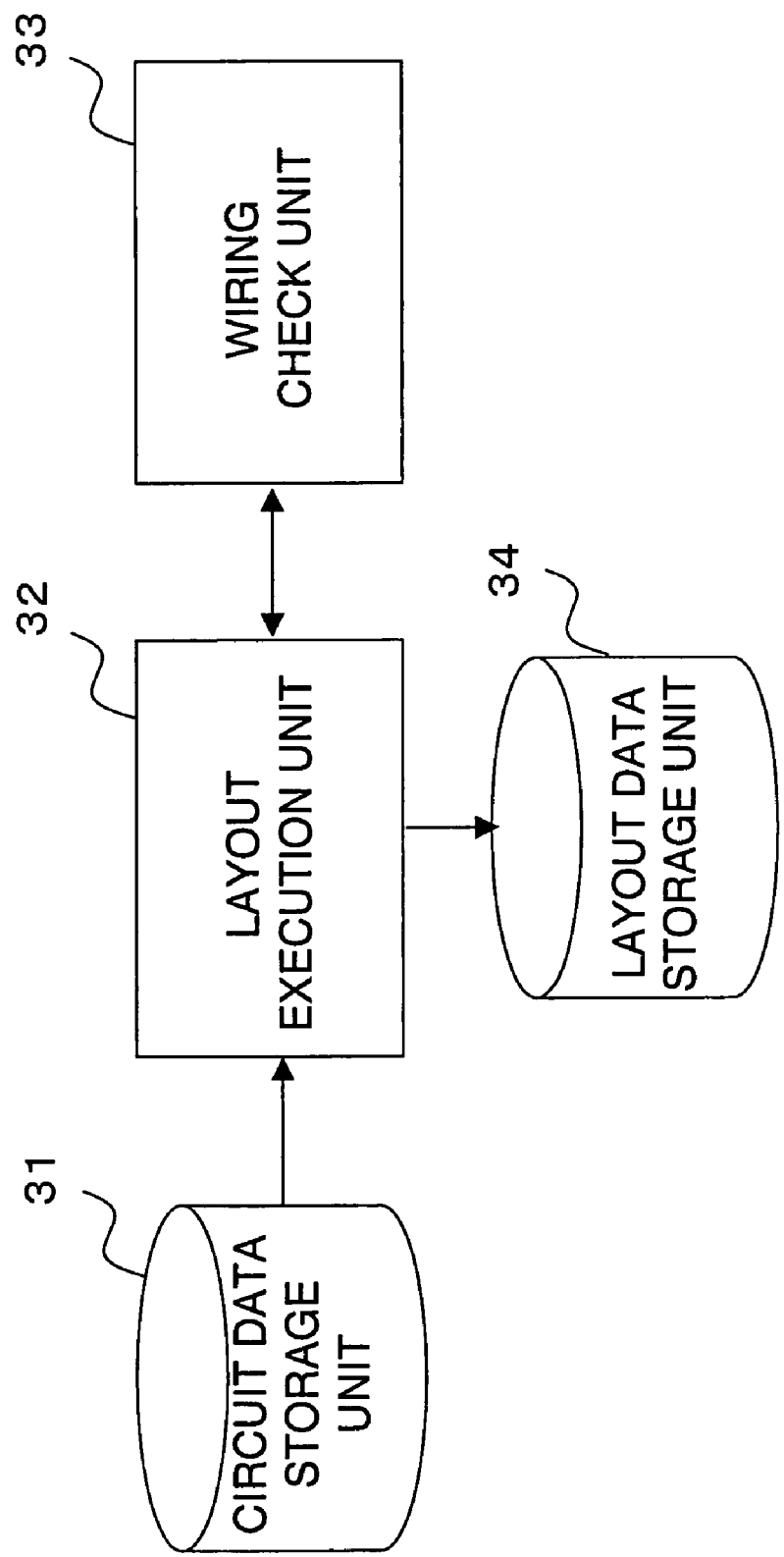
FIG. 4 is a block diagram showing a configuration of a designing apparatus of the semiconductor integrated circuit according to an embodiment of the present invention.

Next, a designing apparatus of the semiconductor integrated circuit according to an embodiment of the present invention will be described. FIG. 4 is a block diagram showing a configuration of the designing apparatus of the semiconductor integrated circuit according to the embodiment of the present invention. Referring to FIG. 4, the designing apparatus of the semiconductor integrated circuit includes a circuit data storage unit 31, a layout execution unit 32, a wiring check unit 33, and a layout data storage unit 34.

Using a system not shown, the circuit data storage unit 31 obtains circuit data on wiring information and the like in advance, for storage, based on information on the functions of the semiconductor integrated circuit and the like.

The layout execution unit 32 reads out the circuit data stored in the circuit data storage unit 31, and executes arrangement and wiring for the circuit. The result of the arrangement and the wiring is delivered to the wiring check unit 33 as layout data. When the layout data for which check by the wiring check unit 33 has been completed does not satisfy the antenna condition based on the manufacturing steps of the semiconductor integrated circuit, the layout execution unit changes a wiring condition again, and executes the arrangement and the wiring for the circuit. When the layout data satisfies the antenna condition, the layout execution unit 32 stores the layout data in the layout data storage unit 34.

The wiring check unit 33 makes a check on the antenna condition based on the layout data. That is, the wiring check unit 33 extracts a wiring directly connected to the gate, and extracts a wiring adjacent to and parallel with this wiring. Then, the wiring check unit 33 extracts the gate capacitance, gate area, areas of the wirings, and an interconnect capacitance between the wirings. Further, the wiring check unit obtains the antenna ratio in the gate, as described in the first to third embodiment, and checks whether the antenna ratio satisfies the specified vale that causes the damage to the gate oxide film (without violation) or not (in violation). The result of the check is notified to the layout execution unit 32.

The layout data storage unit 34 stores the layout data that satisfies the antenna condition. This layout data is referred to when the semiconductor integrated circuit is manufactured.

Figure 5:
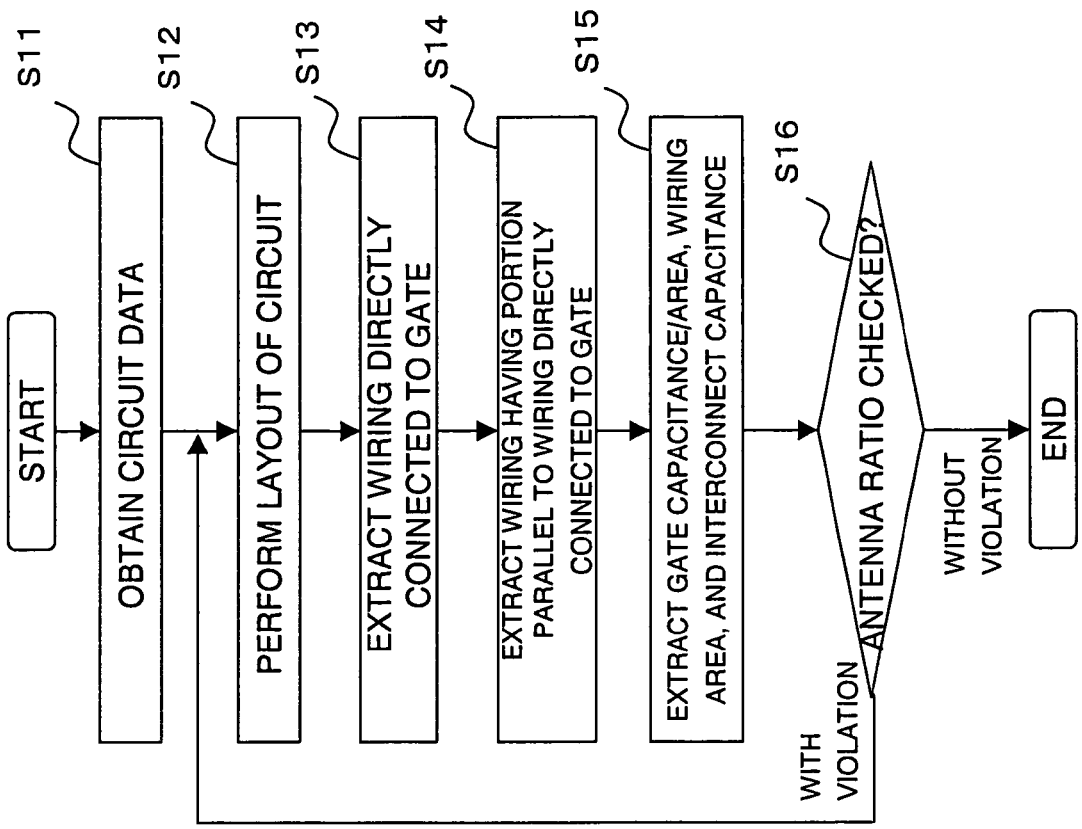
FIG. 5 is a flowchart showing a design method of the semiconductor integrated circuit according to an embodiment of the present invention.

Next, a design method of the semiconductor integrated circuit will be described. FIG. 5 is a flowchart showing the design method of the semiconductor integrated circuit according to an embodiment of the present invention. When design is started, the layout execution unit 32 obtains from the circuit data storage unit 31 the circuit data necessary for the layout of the semiconductor integrated circuit targeted for the design at step S11.

At step S12, based on the obtained circuit data, the layout of the semiconductor integrated circuit is performed. At this point, the wiring check unit 33 is made to check whether the violation of the antenna ratio is present or not. When the violation of the antenna ratio has occurred, the layout of the wirings is changed. The spacing of the wirings is expanded, or the wiring route is altered, for example. Further, insertion of the repeater cell or the diode cell as described in the prior art is performed.

At step S13, a wiring directly connected to the gate is extracted.

At step S14, extraction of a wiring having a portion adjacent to and parallel with the wiring directly connected to the gate is extracted.

At step S15, the gate capacitance and gate area of the gate, areas of the wirings, and the interconnect capacitance between the wirings are extracted.

At step S16, the wiring check unit 33 obtains the antenna ratio and checks whether the antenna ratio satisfies the specified value that causes the damage to the gate oxide film (without the violation) or not (with the violation). When the violation is present, the operation is returned to the step S12. When the violation is not present, the layout is completed.

As described above, according to this embodiment, the layout of the semiconductor integrated circuit that satisfies the antenna ratio is performed, and the design of the semiconductor integrated circuit in sufficient consideration of the influence of the charge-up will be performed.

Fifth Embodiment

Figure 6:
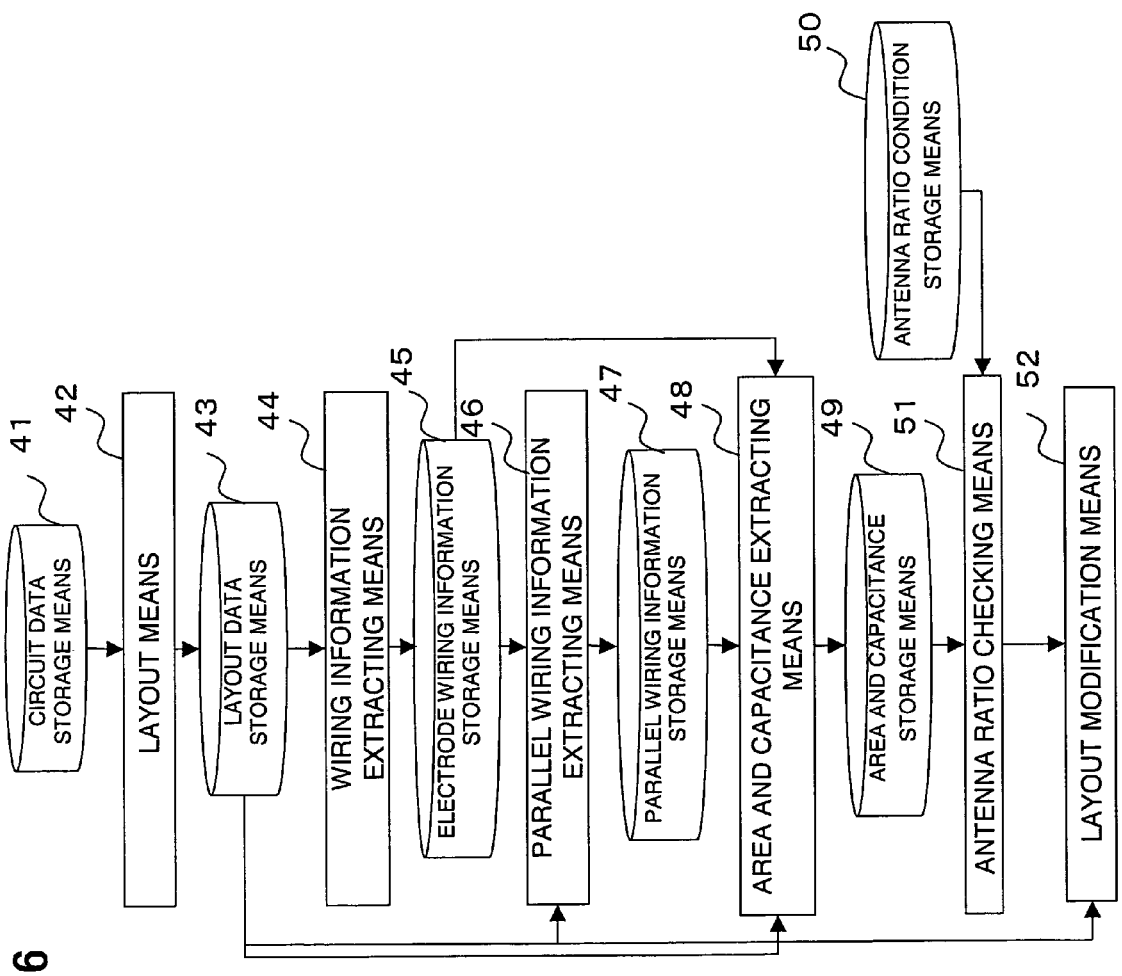
FIG. 6 is a block diagram showing a configuration of a program for performing layout of wirings in the semiconductor integrated circuit according to an embodiment of the present invention.

Next, a program for designing the semiconductor integrated circuit according to an embodiment of the present invention will be described. FIG. 6 is a block diagram showing a configuration of the program for performing layout of wirings in the semiconductor integrated circuit according to the embodiment of the present invention. Referring to FIG. 6, the program for performing the layout of the wirings includes layout means 42, wiring information extracting means 44, parallel wiring information extracting means 46, area and capacitance extracting means 48, antenna ratio checking means 51, and layout modification means 52. As storage means for storing information used in the program, circuit data storage means 41, layout data storage means 43, electrode wiring information storage means 45, parallel wiring information storage means 47, area and capacitance storage means 49, and antenna ratio condition storage means 50 are provided.

The layout means 42 performs layout for circuit data stored in the circuit data storage means 41, and stores the result of the layout in the layout data storage means 43. The layout data for the circuit such as a wiring width, a wiring length, and a capacitance between adjacent wirings is stored in the layout data storage means 43. Information in FIG. 3 shown before is a part of information stored as the layout data.

The wiring information extracting means 44 extracts from the layout data stored in the layout data storage means 43 information on an electrode provided insulated from the diffusion layer and information on a wiring connected to this electrode, and stores the result of extraction in the electrode wiring information storage means 45. The electrode wiring information storage means 45 stores information on the gate 12, wiring 13, and wiring 14 in an example shown in FIG. 3.

The parallel wiring information extracting means 46 extracts a wiring having a portion parallel to the wiring connected to the electrode stored in the electrode wiring information storage means 45 from the layout data stored in the layout data storage means 43. When a wiring having a portion parallel to the extracted wiring is further present, the parallel wiring information extracting means 46 extracts the wiring as well. Then, the parallel wiring information extracting means 46 extracts the predetermined number of parallel wirings one after another, and stores them in the parallel wiring information storage means 47. The parallel wiring information storage means 47 stores information on each of the wiring 15 having a portion parallel to the wiring 13, wirings 16 and 18 having portions parallel to the wiring 14, the wiring 19 having a portion parallel to the wring 15, and the wirings 17 and 20 having portions parallel to the wiring 16, and the wiring 21 having a portion parallel to the wiring 20 in the example shown in FIG. 3.

The area and capacitance extracting means 48 extracts from the layout data stored in the layout data storage means 43 information shown in following (1) to (6), based on the information stored in the electrode wiring information storage means 45 and the information stored in the parallel wiring information storage means 47, for storage in the area and capacitance storage means 49. Specific reference values will be indicated, using the case of FIG. 3 as an example.

(1) the capacitance and area of an electrode insulated from the diffusion layer. In the case of FIG. 3, G_Area, G_Cap.
(2) the area of a wiring connected to the electrode insulated from the diffusion layer. In the case of FIG. 3, MG1_Area, MG2_Area.
(3) the area of a wiring having a portion parallel to the wiring connected to the electrode insulated from the diffusion layer. In the case of FIG. 3, M1_Area, M2_Area, and MG22_Area.
(4) the area of a wiring having a portion parallel to the wiring in (3). When there is another wiring having a portion parallel to this wiring, the area of the wiring. In the case of FIG. 3, M3_Area, M4_Area, M22_Area, M43_Area.
(5) an adjacent parasitic capacitance between the wiring in (2) and the wiring in (3). In the case of FIG. 3, M1_Cap, MG22_Cap.
(6) an adjacent parasitic capacitance between the wiring in (3) and the wiring in (4). In the case of FIG. 3, M3_Cap, M22_Cap, M43_Cap.

The antenna ratio checking means 51 calculates the antenna ratio from information stored in the area and capacitance storage means 49, and compares the calculated antenna ratio with a predetermined antenna ratio stored in the antenna ratio condition storage means 50, which gives the charge-up damage to the insulating film of the electrode. In the case of FIG. 3, calculation of the antenna ratio is performed, as in the third embodiment.

The layout modification means 52 performs wiring modification on the layout data stored in the layout data storage means 43 when the result of comparison by the antenna ratio checking means 51 shows the violation (or the calculated antenna ratio exceeds the antenna ratio stored in the antenna ratio condition storage means 50).

The program configured as described above is executed by a computer constituting the designing apparatus. According to the program as described above, layout of the semiconductor integrated circuit that satisfies the antenna ratio is performed. The design of the semiconductor integrated circuit in sufficient consideration of the influence of the charge-up will be performed.

Sixth Embodiment

Figure 7:
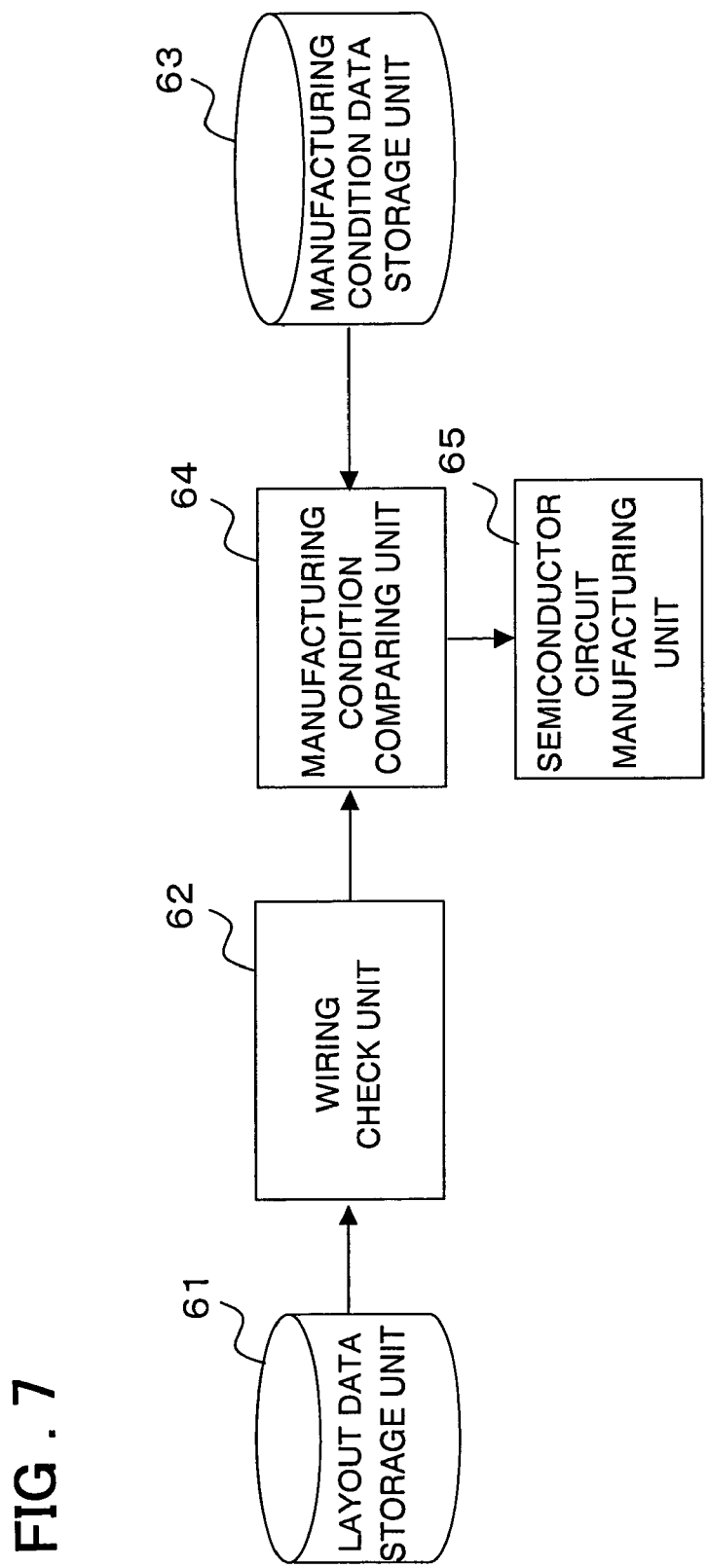
FIG. 7 is a block diagram showing a configuration of a manufacturing apparatus of the semiconductor integrated circuit according to an embodiment of the present invention.

Next, a manufacturing apparatus of the semiconductor integrated circuit according to an embodiment of the present invention will be described. FIG. 7 is a block diagram showing a configuration of the manufacturing apparatus of the semiconductor integrated circuit according to the embodiment of the present invention. Referring to FIG. 7, the manufacturing apparatus of the semiconductor integrated circuit includes a layout data storage unit 61, a wiring check unit 62, a manufacturing condition data storage unit 63, a manufacturing condition comparing unit 64, and a semiconductor circuit manufacturing unit 65.

The layout data storage unit 61 stores layout data for the semiconductor integrated circuit targeted for manufacturing.

The wiring check unit 62 extracts a wiring directly connected to the gate based on the layout data and extracts a wiring adjacent to and in parallel with this wiring. Then, the wiring check unit 62 extracts the gate capacitance, gate area, areas of the wirings, and an interconnect capacitance between the wirings, and obtains the antenna ratio as described in the first to third embodiment. Information on the obtained antenna ratio is delivered to the manufacturing condition comparing unit 64.

The manufacturing condition data storage unit 63 determines conditions in the manufacturing steps of the manufacturing apparatus such as the antenna ratio determined from a plasma condition, in advance, for storage.

The manufacturing condition comparing unit 64 compares the antenna ratio obtained by the wiring check unit 62 with the antenna ratio stored in the manufacturing condition data storage unit 63. When it is found as the result of comparison that the antenna ratio obtained by the wiring check unit 62 satisfies the antenna ratio stored in the manufacturing condition data storage unit 63, the manufacturing condition comparing unit 64 notifies the semiconductor circuit manufacturing unit 65 that the semiconductor integrated circuit should be manufactured according to the manufacturing conditions determined in advance. When it is found that the antenna ratio is not satisfied, the manufacturing condition comparing unit 64 notifies the semiconductor circuit manufacturing unit 65 that adjustment of the manufacturing conditions such as adjustment of reducing a plasma etching speed or the like should be made. Alternatively, when it is found that the antenna ratio is not satisfied, an approach may be used in which data on a plurality of manufacturing conditions is stored in advance, and an optimal condition is selected from the plurality of manufacturing conditions according to the antenna ratio.

The semiconductor circuit manufacturing unit 65 manufactures the semiconductor circuit using the steps of mask manufacture, wafer process execution, assembly, and the like, according to the manufacturing conditions, thereby completing the semiconductor integrated circuit.

Figure 8:
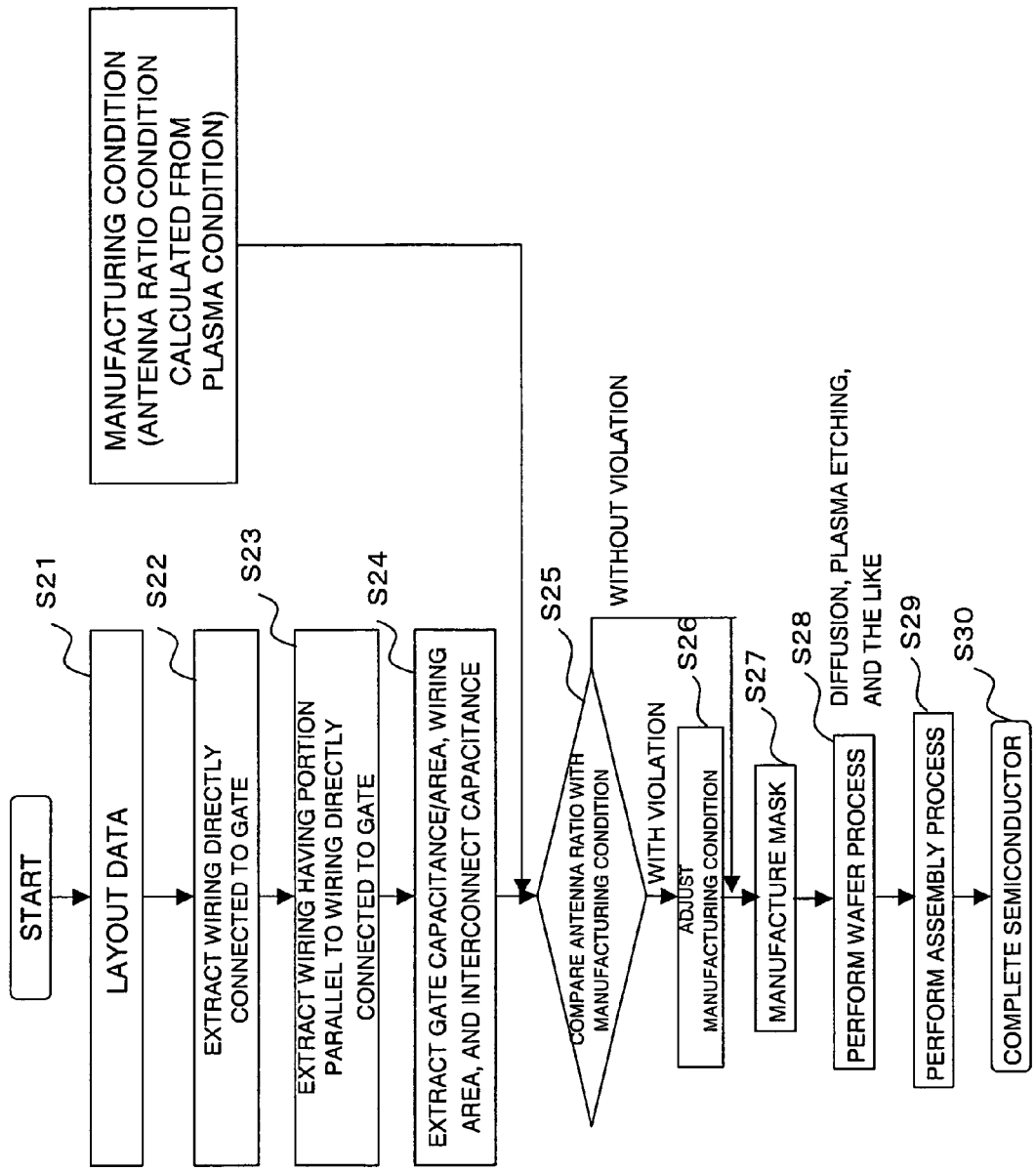
FIG. 8 is a flowchart showing a manufacturing method of the semiconductor integrated circuit according to an embodiment of the present invention.
Figure 9:
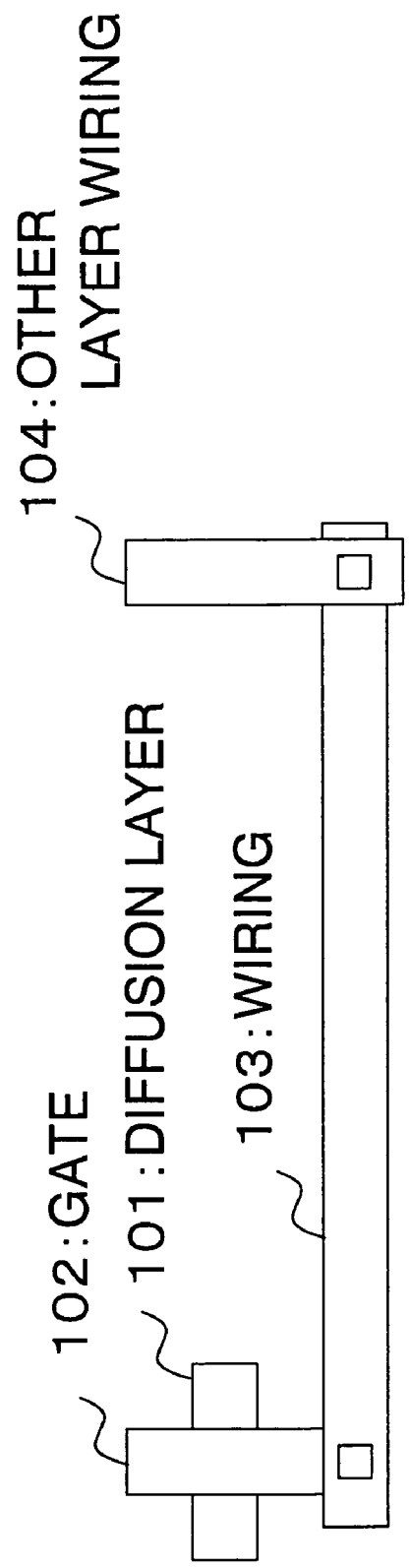
FIG. 9 is a diagram explaining a layout of wirings in a conventional semiconductor integrated circuit.

Next, a manufacturing method of the semiconductor integrated circuit will be described. FIG. 8 is a flowchart showing the manufacturing method of the semiconductor integrated circuit according to an embodiment of the present invention. After the start of the operation, the wiring check unit 62 obtains from the layout data storage unit 61 the layout data of the semiconductor integrated circuit targeted for manufacturing, at step S21.

At step S22, the wiring directly connected to the gate is extracted from the layout data.

At step S23, the wiring having the portion adjacent to and parallel with the wiring directly connected to the gate is extracted from the layout data.

At step S24, the gate capacitance and gate area of the gate and the areas of the wirings and the interconnect capacitance between the wirings are extracted.

The manufacturing condition comparing unit 64 obtains the antenna ratio determined by the layout of the wirings, for comparison with the antenna ratio determined from the manufacturing conditions (such as the plasma condition) of the semiconductor integrated circuit. When the antenna ratio in the layout of the wirings is smaller than the antenna ratio determined from the manufacturing conditions (without the violation), the operation proceeds to step S27. When the antenna ratio is larger (which is the violation of the antenna ratio), the operation proceeds to the step S26.

At step S26, the manufacturing condition comparing unit 64 notifies the semiconductor circuit manufacturing unit 65 that adjustment of the manufacturing conditions such as reduction of the plasma etching speed should be made, for example.

At step S27, the semiconductor circuit manufacturing unit 65 manufactures the mask of the semiconductor integrated circuit.

At step S28, using the manufactured mask, a wafer process such as diffusion and plasma etching is performed on the semiconductor integrated circuit based on the manufacturing conditions.

At step S29, wafer cutting is performed, and wiring and the like are performed, thereby assembling the semiconductor integrated circuit.

At step S30, the semiconductor integrated circuit is completed.

As described above, according to this embodiment, a semiconductor integrated circuit without the device degradation, in sufficient consideration of the influence caused by the charge-up so as to satisfy the antenna ratio determined from the manufacturing conditions will be manufactured.

According to the present invention, the following specific modes are further realized.

Mode 1. A designing apparatus for a semiconductor integrated device comprising: a circuit data storage unit for storing circuit data on a semiconductor integrated device targeted for design; a layout execution unit for reading out the circuit data stored in said circuit data storage unit, for execution of circuit arrangement and wiring, and delivering a result of the arrangement and the wiring to a wiring check unit as layout data, said layout execution unit also changing a wiring condition and executing the circuit arrangement and wiring again when the layout data checked by said wiring check unit does not satisfy an antenna condition, and storing the layout data in a layout data storage unit when the layout data satisfies the antenna condition; a wiring check unit for checking whether an area ratio of a sum of an area of a first wiring plus a summation of all areas of a (k+1)th wiring multiplied by a predetermined coefficient $a_k$, (k being an integer equal to or larger than one) ranging from one to n, (n being an integer equal to or larger than one) to an electrode of an element is equal to or less than a predetermined value that gives charge-up damage to an insulating film of said electrode, and notifying a result of the check to said layout execution unit, said first wiring being connected to said electrode of said element, said electrode of said element being provided insulated from a diffusion layer of an element in said semiconductor integrated circuit, the (k+1)th wiring being parallel to and adjacent to the kth wiring; and a layout data storage unit for storing the layout data satisfying the antenna condition.

Mode 2. The designing apparatus for a semiconductor integrated device according to Mode 1, wherein each of the areas includes at least one of a surface area and a side area.

Mode 3. The designing apparatus for a semiconductor integrated device according to Mode 1, wherein the predetermined coefficient $a_k$ is a value determined from an electrode capacitance of said electrode and each wiring capacitance between the mth wiring and the (m+1)th wiring (m being an integer ranging from one to k).

Mode 4. The designing apparatus for a semiconductor integrated circuit according to Mode 1, wherein at least one of said first to (k+1)th wirings is wired across two or more wiring layers.

Mode 5. The designing apparatus for a semiconductor integrated circuit according to Mode 1, wherein each of the second to (k+1)th wirings comprises j wires (j being an integer equal to or larger than one).

Mode 6. A manufacturing apparatus for a semiconductor integrated device comprising: a layout data storage unit for storing layout data on said semiconductor integrated device targeted for manufacturing; a wiring check unit for checking whether an area ratio of a sum of an area of a first wiring plus a summation of all areas of a (k+1)th wiring multiplied by a predetermined coefficient $a_k$, (k being an integer equal to or larger than one) ranging from one to n,(n being an integer equal to or larger than one), to an electrode area of an electrode is equal to or less than a predetermined value that gives charge-up damage to an insulating film of said electrode based on the layout data, and delivering a result of the check to a manufacturing condition comparing unit, said first wiring being connected to said electrode provided insulated from a diffusion layer of an element in said semiconductor integrated circuit, the (k+1)th wiring being parallel to and adjacent to the kth wiring; a manufacturing condition data storage unit for storing manufacturing conditions for the manufacturing; a manufacturing condition comparing unit for comparing an antenna ratio obtained by said wiring check unit with an antenna ratio stored in said manufacturing condition data storage unit, notifying a semiconductor integrated device manufacturing unit to manufacture said semiconductor integrated device according to a predetermined one of the manufacturing conditions when the antenna ratio obtained by said wiring check unit satisfies the antenna ratio stored in said manufacturing condition data storage unit as a result of the comparison, and notifying said semiconductor integrated device manufacturing unit to adjust the predetermined one of the manufacturing conditions when the antenna ratio obtained by said wiring check unit does not satisfy the antenna ratio stored in said manufacturing condition data storage unit; and a semiconductor integrated device manufacturing unit for manufacturing said semiconductor integrated device according to the predetermined one of the manufacturing conditions or the adjusted manufacturing condition.

Mode 7. The manufacturing apparatus for a semiconductor integrated device according to Mode 6, wherein each of the areas includes at least one of a surface area and a side area.

Mode 8. The manufacturing apparatus for a semiconductor integrated device according to Mode 6, wherein the predetermined coefficient $a_k$ is a value determined from an electrode capacitance of said electrode and each wiring capacitance between the mth wiring and the (m+1)th wiring (m being an integer ranging from one to k).

Mode 9. The manufacturing apparatus for a semiconductor integrated circuit according to Mode 6, wherein at least one of said first to (k+1)th wirings is wired across two or more wiring layers.

Mode 10. The manufacturing apparatus for a semiconductor integrated circuit according to Mode 6, wherein each of the second to (k+1)th wirings comprises j wires (j being an integer equal to or larger than one).

Mode 11. A computer program for performing layout of first to (n+1)th wirings (n being an integer equal to or larger than one), said computer program causing a computer to function as: layout means for performing layout on circuit data of a semiconductor integrated device targeted for design and storing a result of the layout in layout data storage means as layout data; wiring information extracting means for extracting from the layout data stored in said layout data storage means electrode information on an element having an electrode provided insulated from a diffusion layer and wiring information on a first wiring connected to said electrode, for storage in electrode wiring information storage means; parallel wiring information extracting means for extracting the (k+1)th wiring parallel to and adjacent to the kth wiring (k being an integer from one to n) from the layout data stored in said layout data storage means and the wiring information on said first wiring stored in said electrode wiring information storage means, for storage in parallel wiring information storage means; area and capacitance extracting means for extracting from the layout data stored in said layout data storage means areas of said first to (k+1)th wirings, a parasitic capacitance between the kth wiring and the (k+1)th wiring, a capacitance of said electrode, and an area of said electrode all stored in said electrode wiring information storage means and said parallel wiring information storage means, for storage in area and capacitance storage means; antenna ratio checking means for calculating an area ratio of a sum of areas of the wirings to an area of said electrode, said sum of the areas of the wirings being given as a sum of an area of said first wiring stored in said area and capacitance storage means plus a summation of areas of the (k+1)th wiring multiplied by a predetermined coefficient $a_k$, where k ranges from one to n (n being an integer equal to or larger than one), and comparing the area ratio with a predetermined value stored in antenna ratio condition storage means; and layout modification means for changing the layout of at least one wiring of said first to (n+1)th wirings when it is found that the area ratio is larger than the predetermined value.

Mode 12. The program according to Mode 11, wherein the predetermined coefficient $a_k$ is a value determined from the capacitance of said electrode and the parasitic capacitance between the mth wiring and the (m+1)th wiring, m being an integer ranging from one to k.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method of designing a wiring layout for a semiconductor integrated device using a designing apparatus, said method comprising:
    insulating a diffusion layer from an element comprising an electrode;
    connecting a first wiring to said electrode; and
    providing an (n+1)th wiring parallel to and adjacent to a nth wiring, where n is an integer greater than or equal to one,
    wherein said first to (n+1)th wirings are arranged such that an area ratio of a sum of an area of said first wiring plus a summation of areas of wirings from a second wiring to said (n+1)th wiring to an electrode area of said electrode is less than or equal to a predetermined value that gives charge-up damage to an insulating film of said electrode, said summation of the areas of the wirings from said second wiring to said (n+1)th wiring being given as a summation of the areas of the wirings from said second wiring to said (n+1)th wiring each multiplied by a predetermined coefficient $a_k$, where k is an integer ranging from one to n.

2. The method according to claim 1, further comprising:
    obtaining circuit data necessary for the layout of said semiconductor integrated device;
    performing the layout of said semiconductor integrated device based on the circuit data;
    extracting said electrode and said first to (n+1)th wirings from the circuit data;
    obtaining respective areas of said first to (n+1)th wirings; and
    obtaining the area ratio from the respective areas and the electrode area; and
    changing the layout of at least one of said first to (n+1)th wirings when the area ratio is larger than the predetermined value.

3. The method according to claim 1, wherein said area of said first wiring, the areas of wirings from the second wiring to said (n+1)th wiring, and said electrode area comprise at least one of a surface area and a side area.

4. The method according to claim 1, wherein the predetermined coefficient $a_k$ is determined from an electrode capacitance of said electrode and a plurality of wiring capacitances between the nth wiring and the (n+1)th wiring.

5. The method according to claim 1, wherein at least one of said first to (n+1)th wirings is wired across two or more wiring layers.

6. The method according to claim 1, wherein the second to (n+1)th wirings comprise j wires (where j is an integer greater than or equal to one).

7. A method of manufacturing a semiconductor integrated device by a manufacturing apparatus, said method comprising:
    insulating a diffusion layer from an element comprising an electrode;
    connecting a first wiring to said electrode; and
    providing an (n+1)th wiring parallel to and adjacent to a nth wiring, where n is an integer greater than or equal to one,
    wherein said first to (n+1)th wirings are arranged such that an area ratio of a sum of an area of said first wiring plus a summation of areas of wirings from a second wiring to said (n+1)th wiring to an electrode area of said electrode is less than an antenna ratio determined from a manufacturing condition of said manufacturing apparatus, said summation of the areas of the wirings from said second wiring to said (n+1)th wiring being given as a summation of the areas of the wirings from said second wiring to said (n+1)th wiring each multiplied by a predetermined coefficient $a_k$, where k is an integer ranging from one to n.

8. The method according to claim 7, further comprising:
    obtaining layout data of said semiconductor integrated device;
    extracting said electrode and said first to (n+1)th wirings from the layout data;
    obtaining respective areas of said first to (n+1)th wirings;
    obtaining the area ratio from the respective areas and the electrode area;
    comparing the area ratio with the antenna ratio;
    adjusting the manufacturing condition of said manufacturing apparatus when the area ratio is larger than the antenna ratio; and
    manufacturing said semiconductor integrated device by said manufacturing apparatus according to the manufacturing condition.

9. The method according to claim 7, wherein said area of said first wiring, the areas of wirings from the second wiring to said (n+1)th wiring, and said electrode area comprise at least one of a surface area and a side area.

10. The method according to claim 7, wherein the predetermined coefficient $a_k$ is determined from an electrode capacitance of said electrode and a plurality of wiring capacitances between the nth wiring and the (n+1)th wiring.

11. The method according to claim 7, wherein at least one of said first to (n+1)th wirings is wired across two or more wiring layers.

12. The method according to claim 7, wherein the second to (n+1)th wirings comprise j wires (where j is an integer greater than or equal to one).

13. A semiconductor integrated circuit device comprising:
- an element including an electrode insulated from a diffusion layer;
- a first wiring connected to said electrode; and
- an (n+1)th wiring parallel to and adjacent to an nth wiring, where n is an integer greater than or equal to one,
- wherein said first to (n+1)th wirings are arranged such that an area ratio of a sum of an area of said first wiring plus a summation of areas of wirings from a second wiring to said (n+1)th wiring to an electrode area of said electrode becomes less than or equal to a predetermined value that gives charge-up damage to an insulating film of said electrode, said summation of the areas of the wirings from said second wiring to said (n+1)th wiring being given as a summation of the areas of the wirings from said second wiring to said (n+1)th wiring each multiplied by a predetermined coefficient $a_k$, where k is an integer ranging from one to n.

14. The semiconductor integrated circuit device according to claim 13, wherein said area of said first wiring, the areas of wirings from the second wiring to said (n+1)th wiring, and said electrode area comprise at least one of a surface area and a side area.

15. The semiconductor integrated circuit device according to claim 13, wherein the predetermined coefficient $a_k$ is determined from an electrode capacitance of said electrode and a plurality of wiring capacitances between the nth wiring and the (n+1)th wiring.

16. The semiconductor integrated circuit device according to claim 13, wherein at least one of said first to (n+1)th wirings is arranged across two or more wiring layers.

17. The semiconductor integrated circuit device according to claim 13, wherein the second to (n+1)th wirings comprise j wires (where j is an integer greater than or equal to one).

\* \* \* \* \*